United States Patent [19]

Joshi et al.

[11] 4,216,573
[45] Aug. 12, 1980

[54] THREE MASK PROCESS FOR MAKING FIELD EFFECT TRANSISTORS

[75] Inventors: Madhukar L. Joshi, Essex Junction; Richard K. Mason, Colchester; Wilbur D. Pricer, Burlington, all of Vt.

[73] Assignee: International Business Machines Corporation, Armonk, N.Y.

[21] Appl. No.: 904,182

[22] Filed: May 8, 1978

[51] Int. Cl.² ............................................. B01J 17/00
[52] U.S. Cl. .................................. 29/571; 29/577 R; 29/578; 29/589; 357/41
[58] Field of Search ..................... 29/571, 577, 578; 357/41, 45

[56] References Cited
U.S. PATENT DOCUMENTS 3,533,158  10/1970  Bower ................................. 29/571

*Primary Examiner*—W. C. Tupman
*Attorney, Agent, or Firm*—Stephen J. Limanek

[57] ABSTRACT

A three mask method is provided for making a field effect transistor which includes the use of a first mask for defining first and second spaced apart diffusion regions, each having first and second ends, a second mask for defining a contact region at the first end of the first and second diffusion regions and for defining a protected region at the gate region and source and drain electrodes of the transistor, the protected region extending between the second ends of the first and second diffusion regions, and a third mask for forming a gate electrode within the protected region and contact electrodes in the contact region. The source and drain electrodes are formed between the gate electrode and the first and second diffusion regions by ion implantation techniques. The surfaces of the first and second diffusion regions between the contact electrodes and the second end of the first and second diffusions are oxidized to provide a crossover arrangement for gate electrode wiring, when desired, without requiring additional process steps.

11 Claims, 20 Drawing Figures

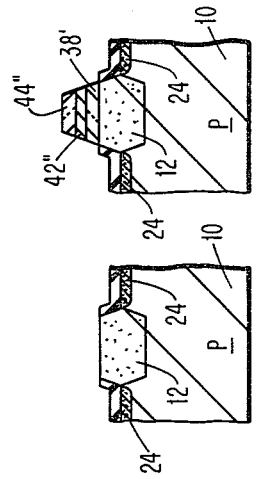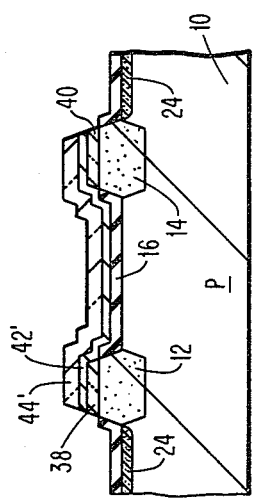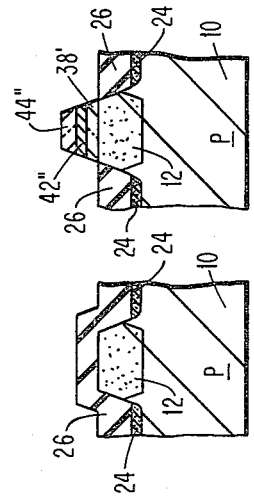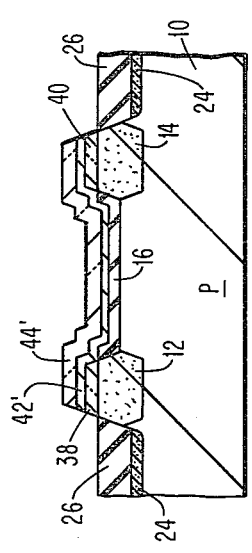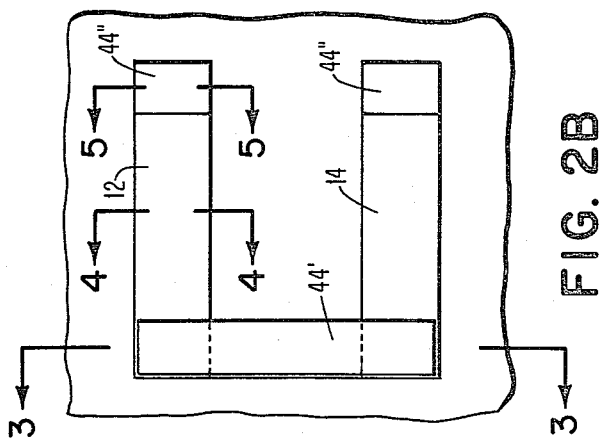

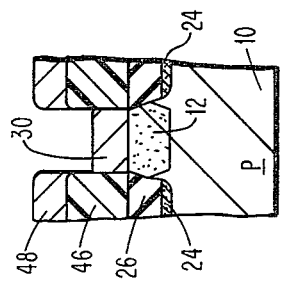
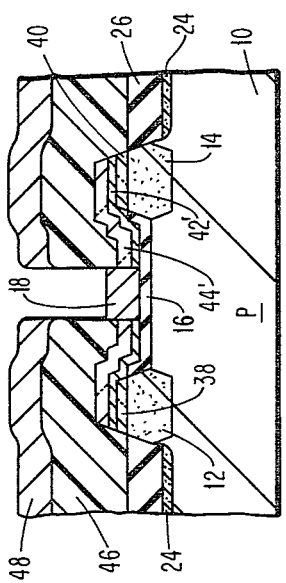
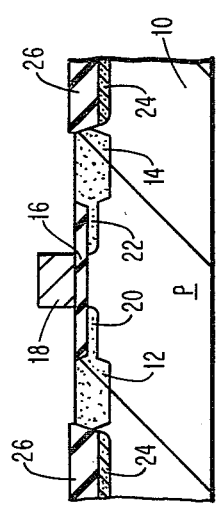
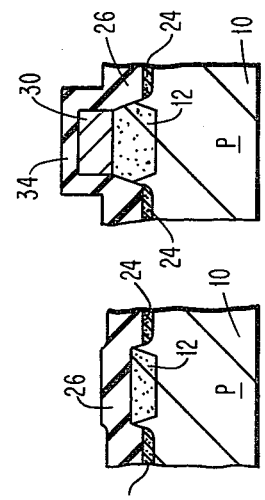
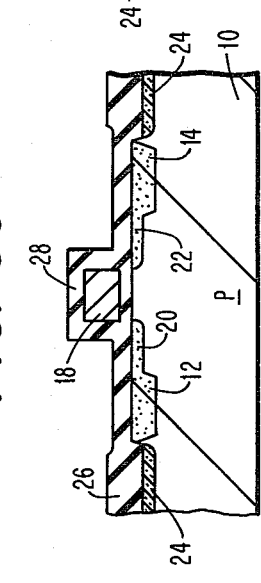
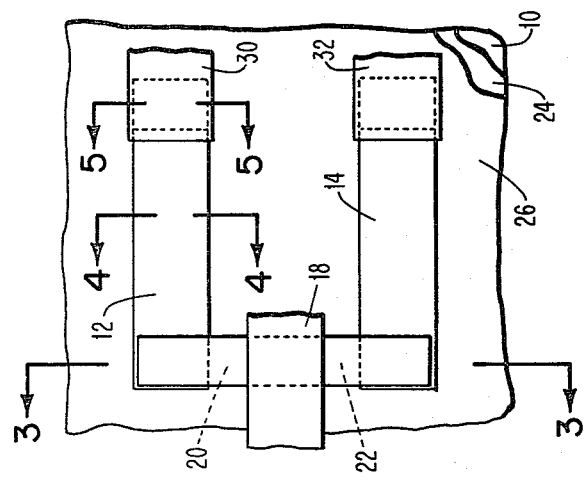

THREE MASK PROCESS FOR MAKING FIELD EFFECT TRANSISTORS

TECHNICAL FIELD

This invention relates to field effect transistors and more particularly to a three mask process for making field effect transistors

BACKGROUND ART

High performance field effect transistors have been made in semiconductor substrates which utilize a very small amount of surface area. However, advantages provided by miniaturization are sometimes negated by mask tolerances required to insure proper alignment between successive masking steps in a process. Furthermore, the need for metallic or conductive contacts and for crossover arrangements for wiring associated with the transistor increases considerably the required surface area and the complexity of the process for making the transistor. Consequently, it is desirable to use processes with self-alignment features, a minimum number of masking steps and a provision for a crossover arrangement which does not require forming an insulating layer above the oxide surface of the semiconductor substrate between metallic or conductive layers.

In IEEE Transactions on Electron Devices, December 1973, in an article entitled, "Three-Mask Self-Aligned MOS Technology", by C. C. Mai et al, pages 1162 to 1164, there is described a simple three mask process for making a field effect transistor.

However, this transistor, having an aluminum gate, uses a process which does not provide self-aligned contacts and it leaves an exposed area near the gate region introducing a potential contamination problem. In commonly assigned U.S. Pat. No. 3,958,323 by F. H. De La Moneda, filed Apr. 29, 1975, there is disclosed another simple three mask process for making a transistor but this process does not provide for self-aligned contacts nor is there a crossover provision which can be utilized by, e. g., a simple formation of an extension of the gate electrode since diffusions in the substrate must be provided after the gate electrode is formed. In U.S. Pat. No. 3,699,646, by L. L. Vadasz, filed Dec. 28, 1970, there is provided a process for making field effect transistors which discloses a provision for making contacts between the gate electrode of a first device and a current carrying electrode of a second device but no provision is made for a crossover arrangement without introducing additional steps to complicate the process. The process disclosed in the above-identified Vadasz patent does have certain advantages over other processes in the prior art in that the process uses polysilicon gates and interconnecting lines which are capable of being oxidized and thus they are self-insulating. For a more detailed description of the advantages of polysilicon gate technology reference may be had to *Solid-State Electronics*, Pergamon Press, 1970, Vol. 13, pp. 1125-1144. Also, it has been found that transistors may be advantageously made by employing metal silicides, as for example, described in U.S. Pat. No. 3,777,364, by R. D. Schinella et al, filed July 31, 1972.

DISCLOSURE OF THE INVENTION

It is an object of this invention to provide an improved process for making a field effect transistor having high product reliability and production yield.

It is another object of this invention to provide a simple masking process for making field effect transistors without sacrificing density or performance.

It is yet another object of this invention to provide an improved process for making a field effect transistor wherein the contacts and the source and drain electrodes are self-aligned.

It is still another object of this invention to provide an improved process with the use of only three masks for making field effect transistors having self-aligned gates and self-aligned contacts and crossover arrangements within a small surface area on a semiconductor substrate with decreased short channel effects.

In accordance with the teachings of this invention, a three mask method is provided for making a field effect transistor which includes the use of a first mask for defining first and second spaced-apart diffusion regions, each having first and second ends, a second mask for defining a contact region at the first end of the first and second diffusion regions and for defining a protected region for the gate region and the source and drain electrodes of the transistor. The protected region extends from the second end of the first diffusion region to the second end of the second diffusion region, and a third mask for forming a gate electrode within the protected region and for forming contact electrodes in the contact region. The source and drain electrodes of the transistor are formed between the gate electrode and the first and second diffusion regions by employing known ion implantation techniques. The surfaces of the first and second diffusion regions between the contact electrodes and the second end of the first and second diffusions are oxidized to provide a crossover arrangement for gate electrode wiring, when desired, without requiring additional process steps for insulating desired wiring connected to the gate electrode and to the source and drain electrodes of the transistor.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 2B is a plan view similar to that illustrated in FIG. 2A, but after a second mask of the process of the invention has been used.

FIGS. 3D and 3E are sectional views taken through 3—3 of FIG. 2B at two different stages of the process when using the second mask.

FIGS. 4B and 4C are sections taken through 4—4 of FIG. 2B during the stages of the process of the invention similar to that of FIGS. 3D and 3E, respectively.

FIGS. 5A and 5B are sections taken through 5—5 of FIG. 2B during stages of the process of the invention also similar to that of FIGS. 3D and 3E, respectively.

FIG. 2C is a plan view similar to that of FIG. 2B but after a third mask of the process of the invention has been used. FIGS. 3F, 3G and 3H are sectional views taken through 3—3 of FIG. 2C at three different stages of the process when using the third mask.

FIG. 4D is a sectional view taken through 4—4 of FIG. 3C during the stage of the process of the invention similar to that of FIG. 3H, and FIGS. 5C and 5D are sections taken through FIG. 2C at 5—5 during the two process stages similar to that of FIGS. 3F and 3H.

Referring to FIG. 1 of the drawing in more detail, there is shown an isometric view of a transistor produced by the three mask process of the present invention. Formed at the surface of a semiconductor substrate 10, which is preferably made of silicon having a P type conductivity, are first and second elongated diffusion regions 12 and 14, of N+ conductivity, arranged substantially parallel to each other. A thin layer of silicon dioxide 16 is formed over the substrate 10 between the surface of the substrate 10 and a gate electrode 18 which is preferably made of doped polycrystalline silicon or polysilicon. Source and drain electrodes 20 and 22 are formed between the diffusion regions 12 and 14 and the gate electrode 18. A channel stop 24 which is made of P material is formed at the surface of semiconductor substrate 10 outside of the gate, source and drain area. A thick oxide or insulator 26 is formed over the substrate 10 in areas away from the thin silicon dioxide layer 16. An insulating layer 28, preferably an oxide of the polysilicon 18, is formed as an insulator around polysilicon layer 18 and around its extension 18' which crosses over the diffusion region 12 and is separated therefrom by the thick oxide 26. The diffusion regions 12 and 14 extend under the thick oxide 26 to contacts 30 and 32, respectively, which are insulated by insulating layers 34 and 36. The contacts 30 and 32 are also preferably made of polysilicon and the insulating layers 34 and 36 are oxides of the polysilicon contacts 30 and 32.

Figure 1:
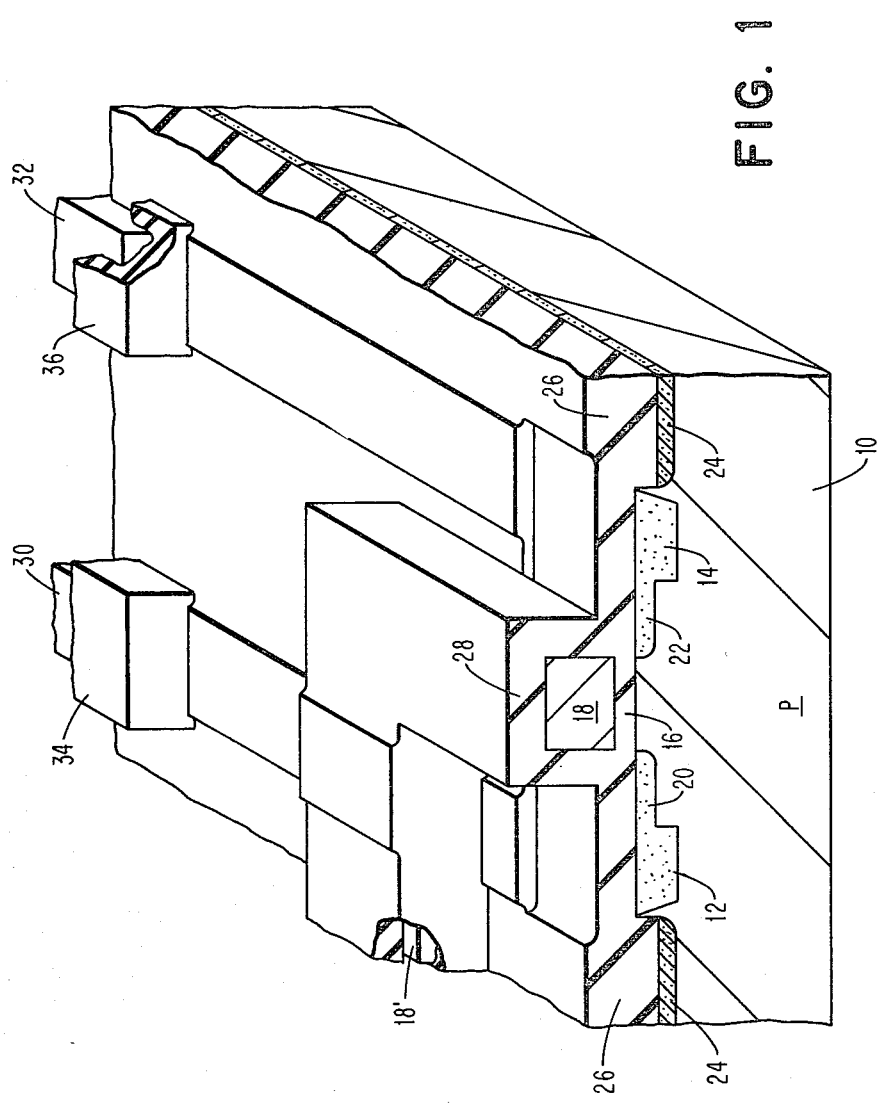
FIG. 1 is an isometric view of a transistor made in accordance with the process of the present invention.

The process for making the field effect transistor illustrated in FIG. 1 of the drawing will now be described.

Figure 4A:
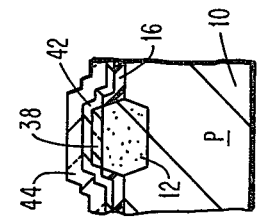
FIG. 4A is a sectional view taken through 4—4 of FIG. 2A during the stage of the process of the invention similar to that of FIG. 3C.
Figure 3A:
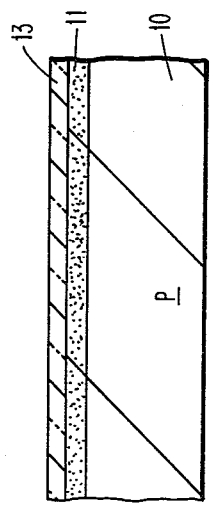
FIG. 3A is a sectional view taken through 3—3 of FIG. 2A prior to the use of the first mask.
Figure 3B:
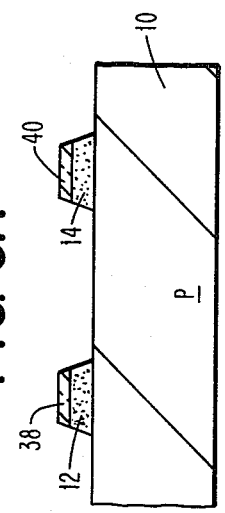
FIGS. 3B and 3C are sectional views taken through 3—3 of FIG. 2A at two different stages of the process when using the first mask.
Figure 3C:
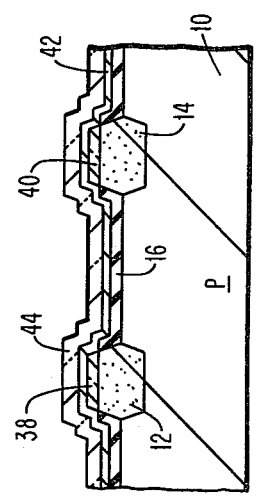
Figure 2A:
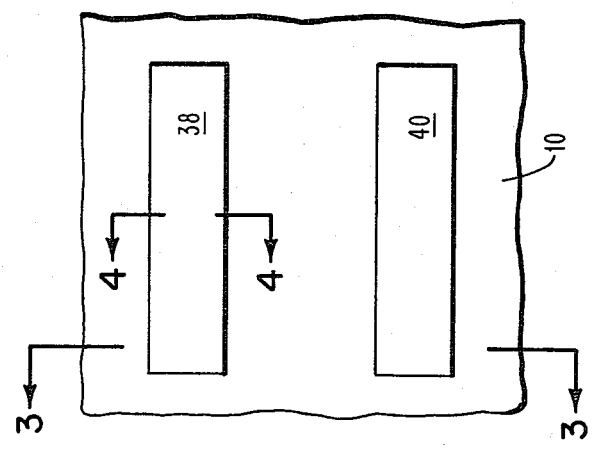
FIG. 2A is a plan view of a semiconductor substrate after using a first mask in the process of the present invention.

Into the surface of the semiconductor substrate 10, N+ ions are shallowly implanted in a high concentration in a known manner to form a diffusion layer 11, as indicated in FIG. 3A of the drawing. Disposed over the diffusion layer 11 is a layer of silicon nitride 13. By employing a first mask and known masking and etching techniques, mesa-like diffusion regions 12 and 14 are formed with strips 38 and 40 of silicon nitride disposed over the diffusion regions 12 and 14, respectively, as shown in FIG. 3B. The silicon nitride may be removed by using warm phosphorus acid or hydrofluoric acid and the doped silicon may be removed by using hydrofluoric acid and nitric acid in water. By known thermal oxidation techniques, the thin silicon dioxide layer 16 is formed on the surface of the substrate 10. A first thin layer of polycrystalline silicon or polysilicon 42 is formed over the silicon dioxide layer 16 and over the silicon nitride strips 38 and 40, with a second layer of silicon nitride 44 deposited over the first polysilicon layer 42, as indicated in FIGS. 3C and 4A of the drawing which are views taken through line 3—3 and 4—4, respectively, of FIG. 2A. The polysilicon layer 42 may be deposited by decomposition of silane in the presence of a boron-containing gas at a temperature of about 900° C. It should be noted that diffusion regions 12 and 14 diffuse into the substrate 10 during the formation of the layers 16, 42 and 44, as indicated in FIGS. 3C and 4A of the drawings.

It can be seen that after using the first mask low resistivity diffusion regions 12 and 14 have been formed along with the gate oxide 16.

By using a second mask in accordance with the process of the invention, a segment 44' of the second layer of silicon nitride 44 is defined between the diffusion regions 12 and 14, as well as, a segment 42' of the first polysilicon layer 42, as shown in FIG. 3D. Also, a segment 44" of the silicon nitride 44 is formed over a segment 38' of the strip of silicon nitride 38 between which is a segment 42" of the first polysilicon layer 42, as indicated in FIG. 5A of the drawing. A suitable etchant for removing the polysilicon layer 42 is hydrofluoric acid and nitric acid in water or hydrofluoric acid, nitric acid and acetic acid in admixture. As indicated in FIG. 4B, the silicon nitride layer 44 has been removed along with the first polysilicon layer 42 to expose the surface of the diffusion region 12. The channel stop 24 is preferably made by implanting P type ions into the surface of the substrate 10 after forming the segments 42' and 44'. FIG. 3E illustrates a section which is similar to that of FIG. 3B except that the thick oxide 26 has been formed by known thermal oxidation techiques. It can be seen that FIG. 4C is similar to FIG. 4B and FIG. 5B is similar to FIG. 5A except for the presence of the thick oxide 26 in FIGS. 4C and 5B.

After using the second mask, it can be seen that the contact sites have been located by segments 38' and 40' and that the thick oxide layer 26 has been formed.

FIG. 2C is a plan view of the semiconductor substrate 10 made after using a third mask in the process of the present invention. A layer of known photoresist 46 is deposited over the structure and with the use of the third mask a gate region is defined between the diffusion regions 12 and 14 by etching away a portion of the photoresist layer 46, the silicon nitride segment 44' and the segment 42' of the first polysilicon layer 42, as indicated in FIG. 3F of the drawings. As is known, the photoresist may be dissolved in a suitable etchant such as butyl acetate or N methyl pyrolidinone. The third mask is also used to expose the contact sites on diffusion regions 12 and 14 after etching away the segments 38', 42" and 44", shown in FIG. 5A. A second layer of polysilicon 48 is then deposited over the structure to form by known lift-off techniques the gate electrode 18, as seen in FIGS. 3F and 3G, and contact electrodes 30 and 32 over diffusion regions 12 and 14, respectively as indicated in FIGS. 2C and 5C. The photoresist layer 46 is then removed in its entirety by known techniques along with the polysilicon layer overlying the photoresist layer 46. Also, the remaining portions of the silicon nitride layers 44', 38 and 40 are etched away by well known dip etch techniques, as is the remaining portion of the first polysilicon layer 42'. By known ion implant techniques, the source and drain electrodes 20 and 22 are formed in substrate 10 between the gate electrode 18 and the diffusion regions 12 and 14, as illustrated in FIG. 3G of the drawings.

By utilizing thermal oxidation techniques, the thick oxide layer 26 is extended over the diffusion regions 12 and 14 and over the source and drain electrodes 20 and 22 and the oxide layer 28 is formed over the electrode 18, as shown in FIG. 3H of the drawings. FIG. 4D which is a section taken through line 4—4 of FIG. 2C illustrates the thick oxide 26 over the diffusion region 12 and FIG. 5D which is a section through line 5—5 of FIG. 2C illustrates the contact electrode 30 provided with the insulating layer 34.

Accordingly, it can be seen that by using the three mask process of the present invention a field effect transistor is produced having a self-aligned gate electrode and self-aligned contact electrodes as well as a crossover arrangement.

Furthermore, although this three mask process produces an improved field effect transistor, it should be understood that many different memory and logic structures can be fabricated by adding one or more masking steps to the process of the present invention.

It should be noted that although doped polysilicon has been used for the gate electrode 18 and for the contact electrodes 30 and 32, it may be replaced by known metal silicides or by a refractory metal such as tantulum with anodic tantulum oxide forming the insulation layer at the surface of the tantulum. Other materials which are thermally, chemically or anodically self-insulatable in an unmasked batch process step may also be used when a plurality of conductive layers are required.

It should be noted that the first layer of polysilicon 42 is not required unless undesirable contamination is introduced by silicon nitride layer 44 into the thin silicon dioxide layer 16.

Although diffusion layer 11 as shown in FIG. 3A of the drawing is preferably formed by ion implantation techniques, if desired this layer may be formed by other known techniques, such as by doped oxide diffusion, capsule diffusion or open-tube diffusion.

While the invention has been particularly shown and described with reference to preferred embodiments thereof, it will be understood by those skilled in the art that various changes in form and details may be made therein without departing from the spirit and scope of the invention.

What is claimed is:

1. A method of making a field effect transistor at a surface of a semiconductor substrate comprising the steps of
   forming first and second spaced apart diffusion regions in said substrate at said surface, at least said first diffusion region having first and second spaced apart portions along said surface,
   forming an insulating layer having a given thickness outside of said diffusion regions in contact with the first portion of said first diffusion region and the second diffusion region,
   defining a protected region on said insulating layer from said first portion of said first diffusion region to said second diffusion region and a contact region at said second portion of said first diffusion region,
   oxidizing the surface of said first diffusion region from said insulating layer at the first portion of said first diffusion region to said contact region to form a second insulating layer having a thickness substantially greater than said given thickness,
   forming a gate electrode within said protected region on said first insulating layer, source and drain electrodes in said substrate between said gate electrode and said first and second diffusion regions, and a contact electrode in contact with said diffusion region at said contact region, and
   forming a conductor extending over said thicker layer along a line spaced from said contact electrode.

2. A method of making at a surface of a semiconductor substrate a field effect transistor having gate and current carrying electrodes comprising the steps of
   forming with a first mask first and second spaced apart diffusion regions in said substrate, at least said first diffusion region having first and second spaced apart portions,
   then oxidizing said semiconductor surface between said first and second diffusion regions to form a first insulating layer having a given thickness,
   defining with a second mask a segment of said insulating layer extending from the first portion of said first diffusion region to said second diffusion region and a contact region at said second portion of said first diffusion,
   oxidizing the surface of said first diffusion region from the segment of said insulating layer at said first portion to said contact region to form a second insulating layer having a thickness substantially greater than said given thickness,
   defining with a third mask a gate region within said insulating layer segment,
   forming a gate electrode in said gate region, an extension of said gate electrode overlying said oxidized diffusion region surface and a contact electrode in said contact region spaced from said extension, and
   forming at least one current carrying electrode in said substrate between said gate electrode and at least one of said first and second diffusion regions.

3. A method of making a semiconductor device on a semiconductor substrate of a first conductivity type comprising the steps of
   providing first and second opposite conductivity type regions covered by a first layer of oxidation retarding material,
   thermally oxidizing the exposed surface of the substrate to form a first insulating medium having a given thickness,
   depositing a second layer of oxidation retarding material over the substrate,
   selectively removing portions of said first and second layers except in a first area extending from said first region to said second region and in a second area within said opposite type region spaced from said first area, said portions being selectively removed including said first layer of oxidation retarding material between said first area and said second area,
   thermally oxidizing areas of the substrate without the remaining portions of said first and second layers to form a second insulating medium from said first area to said second area having a thickness substantially greater than said given thickness,
   selectively providing a masking layer on the substrate except where conductive interconnections are required within said first and second areas,
   removing exposed portions of said first and second layers,
   depositing a layer of conductive interconnection material on the substrate,
   removing said masking layer and overlying portions of said conductive layer,
   removing the remaining portions of said first and second layers, and thermally oxidizing the exposed areas of said substrate.

4. A method of making a field effect transistor at a surface of a semiconductor substrate which includes the steps of:
forming a diffusion region having first and second spaced apart portions in said substrate,
then forming a first insulating layer of a given thickness outside of said diffusion region in contact with the first portion of said diffusion region,
defining a contact region at the second portion of said diffusion region and a transistor region on said insulating layer,
oxidizing said diffusion region from said contact region to said insulating layer at the first portion of said diffusion region to form a second insulating layer having a thickness substantially greater than said given thickness, and
forming within said transistor region a gate electrode on said first insulating layer and a current carrying electrode in said substrate from said gate electrode to the first portion of said diffusion region and a contact electrode in contact with said diffusion region at said contact region,
forming a conductor extending over said thicker layer along a line spaced from said contact electrode.

5. A method as set forth in claim 1 wherein said first diffusion region is formed into an elongated diffusion region extending along the surface of said substrate by ion implantation and etching.

6. A method as set forth in claim 1 wherein said protected region and said contact region are defined simultaneously.

7. A method as set forth in claim 1 wherein said gate electrode is formed by a lift-off process.

8. A method as set forth in claim 1 wherein said source and drain electrodes are formed by an ion implantation technique.

9. A method as set forth in claim 1 wherein said gate electrode and said contact electrode are formed simultaneously.

10. A method as set forth in claim 9 wherein said gate electrode is connected to said conductor.

11. A method as set forth in claim 2 wherein said masks have given openings and said second mask has an opening at least partially aligned with said first diffusion region forming said contact region entirely within said diffusion region.

* * * * *